(12) United States Patent
Adusumilli et al.

(10) Patent No.: US 9,564,310 B1
(45) Date of Patent: Feb. 7, 2017

(54) METAL-INSULATOR-METAL CAPACITOR FABRICATION WITH UNITARY SPUTTERING PROCESS

(71) Applicant: International Business Machines Corporation, Armonk, NY (US)

(72) Inventors: Praneet Adusumilli, Albany, NY (US); Alexander Reznicek, Troy, NY (US); Oscar Van Der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/945,390

(22) Filed: Nov. 18, 2015

(51) Int. Cl.
*H01L 21/8242* (2006.01)
*H01L 21/02* (2006.01)
*H01L 49/02* (2006.01)

(52) U.S. Cl.
CPC ... *H01L 21/02266* (2013.01); *H01L 21/02183* (2013.01); *H01L 28/60* (2013.01)

(58) Field of Classification Search
None
See application file for complete search history.

(56) References Cited

U.S. PATENT DOCUMENTS

| | | | |
|---|---|---|---|
| 3,666,876 A | 5/1972 | Forster | |
| 6,373,087 B1 | 4/2002 | Harris et al. | |
| 6,518,142 B2 | 2/2003 | Yamamoto | |
| 6,573,150 B1 | 6/2003 | Urdahl et al. | |
| 6,586,797 B2 | 7/2003 | Forbes et al. | |
| 6,730,601 B2 | 5/2004 | Harris et al. | |
| 7,041,546 B2 | 5/2006 | Morozumi et al. | |
| 7,135,734 B2 | 11/2006 | Eldridge et al. | |
| 7,335,569 B2 | 2/2008 | Senzaki | |
| 7,582,901 B2 | 9/2009 | Takeda et al. | |
| 8,003,462 B2 | 8/2011 | Nakabayashi | |
| 2004/0169255 A1* | 9/2004 | Kiyotoshi | H01L 23/5223 257/532 |
| 2006/0180842 A1* | 8/2006 | Shibata | H01G 4/08 257/300 |

(Continued)

OTHER PUBLICATIONS

D-K Kim et al., "Electrical and mechanical properties of tantalum nitride thin films deposited by reactive sputtering," Journal of Crystal Growth, 2005, pp. 404-408, vol. 283, Elsevier.

(Continued)

*Primary Examiner* — Alexander Ghyka
(74) *Attorney, Agent, or Firm* — Daniel P. Morris, Esq.; Otterstedt, Ellenbogen & Kammer, LLP

(57) ABSTRACT

A method for the formation of a MIM capacitor on a substrate is described. Initially, a target comprising a metal is sputtered in the presence of nitrogen to form at least a portion of a bottom electrode. Next, the target is further sputtered in the presence of oxygen to form at least a part of an insulator. Finally, the target is even further sputtered in the presence of nitrogen to form a portion of a top electrode. The insulator is sandwiched between the bottom electrode and the top electrode. The formation of the bottom electrode, the insulator, and the top electrode is performed in a sputter deposition chamber without removing the substrate therefrom.

15 Claims, 3 Drawing Sheets

(56) References Cited

U.S. PATENT DOCUMENTS

| | | | |
|---|---|---|---|
| 2006/0216901 A1* | 9/2006 | Olewine | H01L 21/76834 |
| | | | 438/396 |
| 2006/0231919 A1* | 10/2006 | Blacka | H01C 7/1013 |
| | | | 257/528 |
| 2006/0286734 A1 | 12/2006 | Mussig et al. | |
| 2010/0207178 A1* | 8/2010 | Takahashi | G11C 11/22 |
| | | | 257/295 |
| 2014/0167992 A1* | 6/2014 | Aruga | H01G 4/38 |
| | | | 341/143 |
| 2015/0259788 A1* | 9/2015 | Nagamine | H01J 37/3417 |
| | | | 204/192.2 |

OTHER PUBLICATIONS

H.W. Jang et al., "Metallic and Insulating Oxide Interfaces Controlled by Electronic Correlations," Science, 2011, pp. 886-889, vol. 331, American Association for the Advancement of Science, US.

P.C. Snijders et al., "A persistent metal-insulator transition at the surface of an oxygen-deficient, epitaxial manganite film," Nanoscale, 2013, pp. 9659-9665, vol. 5(20), Royal Society of Chemistry, UK.

* cited by examiner

METAL-INSULATOR-METAL CAPACITOR FABRICATION WITH UNITARY SPUTTERING PROCESS

BACKGROUND

The present invention relates to the electrical, electronic, and computer arts, and, more particularly, to methods for forming metal-insulator-metal capacitors.

As the dimensions of semiconductor device shrink, it becomes increasingly more difficult to create capacitor structures that can meet desired performance metrics. Metal oxides such as tantalum pentoxide ($Ta_2O_5$) and similar metal oxides are promising candidates as insulators in metal-insulator-metal (MIM) capacitors due to their desirable physical and electrical properties. Tantalum pentoxide ($Ta_2O_5$), for example, may have a dielectric constant of about 25, while silicon dioxide ($SiO_2$) may have a dielectric constant of only about 3.9. Nevertheless, significant challenges exist in controlling the resistivity of metal layers in such capacitors, as well as in creating stable interfaces with little or no intermixing between dielectric and metal layers. At the same time, as with any semiconductor fabrication process, there is the desire to keep cost, process complexity, and the number of process steps as low as possible.

There is, as a result, a need for new processing methodologies for forming MIM capacitors.

SUMMARY

Embodiments of the invention provide methods of forming MIM capacitors utilizing a unitary, substantially-continuous reactive sputtering process. During sputtering, gas flows of nitrogen and oxygen are modulated while a metal is sputtered to form the desired film stack. The MIM capacitors may comprise nitrides and oxides of a given metal, and in some cases oxynitrides of that metal. Interfaces may be sharp or may be graded. In this manner, a MIM capacitor may be tailored to provide the desired mechanical and electrical properties, as well as the desired stability.

Aspects of the invention are directed to a method for the formation of a MIM capacitor on a substrate. Initially, a target comprising a metal is sputtered in the presence of nitrogen to form at least a portion of a bottom electrode. Next, the target is further sputtered in the presence of oxygen to form at least a portion of an insulator. Finally, the target is even further sputtered in the presence of nitrogen to form at least a portion of a top electrode. The insulator is sandwiched between the bottom electrode and the top electrode. The formation of the bottom electrode, the insulator, and the top electrode is performed in a sputter deposition chamber without removing the substrate therefrom.

Additional aspects of the invention are directed to an integrated circuit formed at least in part using a method like that set forth in the previous paragraph.

Even additional aspects of the invention are directed to a MIM capacitor comprising a bottom electrode, an insulator, and a top electrode. The bottom electrode comprises a nitride of a metal. The insulator is disposed on the bottom electrode and comprises an oxide of the metal. Lastly, the top electrode is disposed on the insulator and comprises a nitride of the metal.

BRIEF DESCRIPTION OF THE SEVERAL VIEWS OF THE DRAWINGS

These and other features, aspects, and advantages of the present invention will become better understood with regard to the following description, appended claims, and accompanying drawings where:

DETAILED DESCRIPTION

Figure 1:
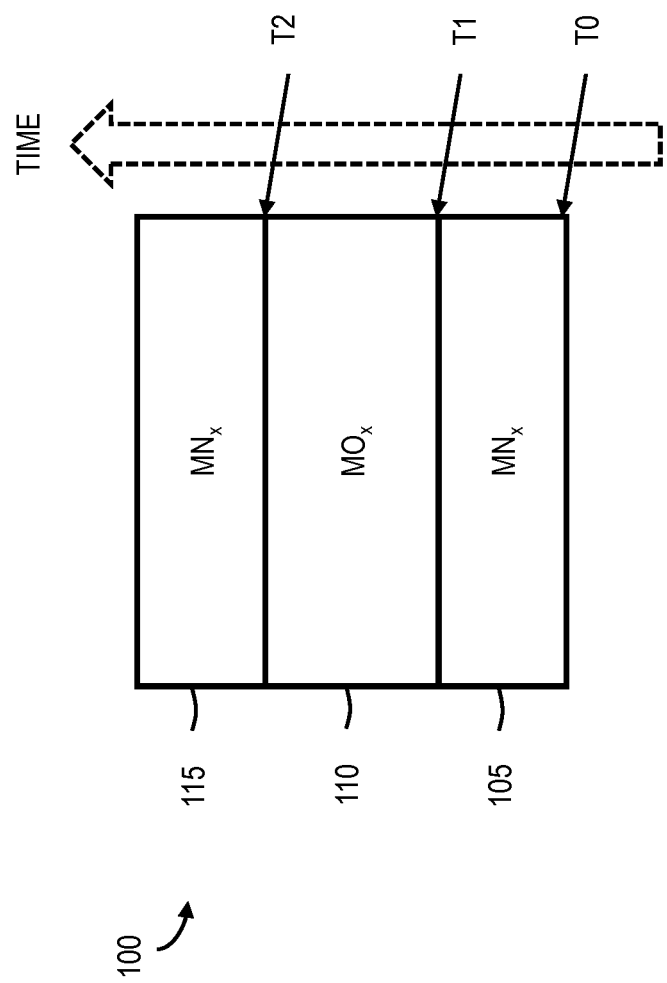
FIG. 1 shows a sectional view of a first MIM capacitor in accordance with an illustrative embodiment of the invention.

The present invention will be described with reference to illustrative embodiments. For this reason, numerous modifications can be made to these embodiments and the results will still come within the scope of the invention. No limitations with respect to the specific embodiments described herein are intended or should be inferred.

Chemical formulas are utilized herein to describe different materials. In these formulas, M represents a metal atom, and x and y are values greater than zero, but are not necessarily integers. The values x and y, moreover, are particular to a given material and therefore may change when going from one material to another, even in the same film stack. As just one example, where $MO_x$ is tantalum pentoxide ($Ta_2O_5$), M would be tantalum (Ta) and x would be equal to 2.5. However, $TaN_x$ in the same film stack as the $Ta_2O_5$ may be characterized by an x very different from 2.5.

Embodiments of the invention will provide means of forming MIM capacitor structures utilizing a single sputter deposition chamber and without removing the sample from that chamber during processing. The processing is therefore in situ. During the formation, deposition of the various components of the capacitor is substantially continuous. As used herein and in the appended claims, "substantially continuous" is intended to mean with little or no time (i.e., less than five seconds) elapsing between deposition steps within the sputter deposition chamber.

Conventional sputter deposition (also called physical vapor deposition (PVD)) is heavily utilized in semiconductor processing and therefore will already be familiar to one having ordinary skill in the relevant arts. At the same time, this deposition method is described in a number of readily available references, including, for example, R. F. Bunshah (editor), *Handbook of Deposition Technologies for Films and Coatings*, Noyes Publications, 1994; and D. M. Mattox et al, *Handbook of Physical Vapor Deposition (PVD) Processing*, William Andrew, 2010, which are both hereby incorporated by reference herein. Briefly, sputter deposition is a vacuum coating process wherein a source of coating material, termed the "target," is mounted opposite the substrate in a vacuum chamber. The vacuum chamber is evacuated to a base pressure, which typically ranges from $10^{-6}$ to $10^{-10}$ Torr, depending on the process. The chamber is then backfilled with a gas, typically comprising argon (Ar), to a pressure of from about 1 to 100 mTorr, and a glow discharge is established to ionize some of the Ar. A negative potential, typically between 0.5 and 5 kV, is applied to the target in order to initiate positive-ion bombardment while the substrate is grounded. Elements from the target are knocked off by the ions and travel to the substrate, where they are deposited.

Reactive sputtering is a form of sputtering wherein at least one of the species to be coated on the substrate enters the sputter deposition chamber in the gas phase. In reactive sputtering, the target is typically either a pure metal or metal alloy. The added gas-phase reactants cause chemical reactions to occur at the target, at the substrate, and in cases of higher working pressure, in the gas phase. The extent of the incorporation of the gas phase constituents into the deposited film is typically related to their flow rates.

FIG. 1 shows a sectional view of a first MIM capacitor 100 in accordance with an illustrative embodiment of the invention. The MIM capacitor 100 comprises a bottom electrode 105, an insulator 110 on the bottom electrode 105, and a top electrode 115 on the insulator 110. These elements are formed on a substrate underlying the bottom electrode 105 (not shown). In the present embodiment, the bottom electrode 105 consists essentially of a metal nitride ($MN_x$), the insulator 110 consists essentially of a metal oxide ($MO_x$), and the top electrode 115 consists essentially of $MN_x$.

In accordance with aspects of the invention, the formation of the bottom electrode 105, the insulator 110, and the top electrode 115 are formed by reactive sputtering in a sputter deposition chamber without removing the substrate therefrom and with little time between forming the constituent layers. Accordingly, because of the unitary and substantially continuous nature of the sputter deposition process, a timeline is provided to the right of the sectional view in FIG. 1, which indicates different temporal points in the processing. The different points in time are indicated by time markers, T0, T1, T2, and so forth.

At time T0, reactive sputter deposition is initiated with a metal target in the presence of Ar and nitrogen ($N_2$) ($Ar/N_2$). This process is maintained long enough to grow the bottom electrode 105. At time T1 the sputter deposition is continued, but oxygen ($O_2$) is abruptly substituted for the $N_2$ to produce an $Ar/O_2$ ambient. The insulator 110 is thereby formed. Finally, at time T2, the $Ar/O_2$ gas mixture is abruptly reverted back to $Ar/N_2$ to grow the top electrode 115.

Advantageously, the switching of gas mixtures in this manner without exposing the sample to an outside ambient between layers and without substantially interrupting the sputtering process allows precise interface control between elements of the MIM capacitor 100. At the same time, control of the $Ar/N_2$ and $Ar/O_2$ ambients allows one to tailor the constituent materials of the film stack. This ability to control the materials and their interfaces allows one to tailor the mechanical and electrical properties of the resultant MIM capacitor 100, as well as its stability. The resistivity of the bottom and top electrodes 105, 115 may, for example, be modified by changing the amount of $N_2$ introduced while forming those elements.

For example, in one or more embodiments, the metal M may comprise Ta and the MIM capacitor 100 may comprise a stack comprising $TaN_x$, $TaO_{2.5}$ (i.e., stoichiometric tantalum pentoxide ($Ta_2O_5$)), and $TaN_x$. Studies have shown that the resistivity of $TaN_x$ can be modified by some seven orders-of-magnitude by varying the ratio of $N_2$ to Ar in the gas phase during the reactive sputtering of Ta. D. Kim et al., in *Journal of Crystal Growth* 283 (2005), pp. 404-408, entitled "Electrical and mechanical properties of tantalum nitride thin films deposited by reactive sputtering," and hereby incorporated by reference herein, obtained the following results for 80 nm of tantalum nitride, where R is the ratio of $N_2$ to Ar gas flows:

TABLE I

RESISTIVITY VERSUS $N_2$:Ar FLOW RATES

| R | Resistivity (mΩ-cm) |
|---|---|
| 0.5 | 1 |
| 1 | $10^3$ |
| 2 | $10^6$ |

Resistivity appears to increase with R. In the present embodiment, with the $TaN_x$ acting as the top and bottom electrodes 105, 115, it is preferred that resistivity be small, meaning that smaller Rs may be more feasible.

Figure 2:
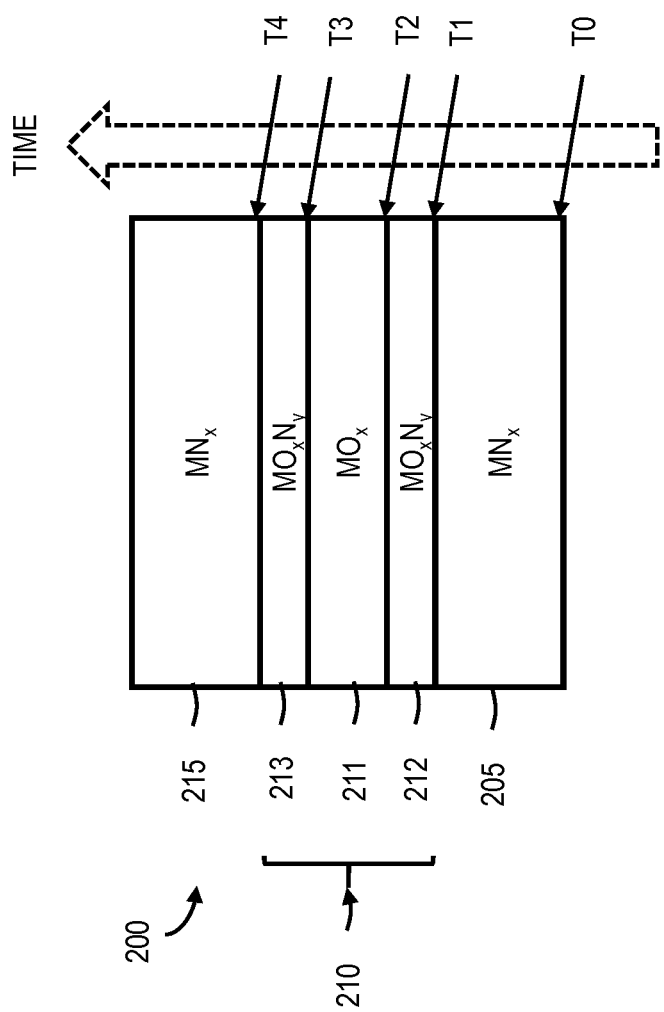
FIG. 2 shows a sectional view of a second MIM capacitor in accordance with an illustrative embodiment of the invention.

While $MO_x$ is solely used for the insulator 110 in the MIM capacitor 100, alternative MIM capacitors may include a multilayer insulator, meaning one made of one or more layers with differing compositions. Such multilayers allow the insulator to be further tailored to achieve the desired properties. One such MIM capacitor, is shown in FIG. 2, which shows a sectional view of a second MIM capacitor 200 in accordance with and illustrative embodiment of the invention. Like FIG. 1, FIG. 2 provides a timeline for the reactive sputtering process used to form the MIM capacitor 200.

The illustrative MIM capacitor 200 comprises a bottom electrode 205 and a top electrode 215, both formed of $MN_x$, and a multilayer insulator 210. The multilayer insulator 210 comprises a layer of $MO_x$ 211 sandwiched between two layers of $MO_xN_y$ 212, 213. The MIM capacitor 200 thereby introduces metal oxynitride layers as part of the insulator 210.

Formation of the MIM capacitor 200 by reactive sputtering is somewhat similar to the formation of the MIM capacitor 100, but both $N_2$ and $O_2$ are flowed simultaneously to form the oxynitride layers. More particularly, at time T0, sputtering is performed in the presence of $Ar/N_2$, and at time T1, $O_2$ is abruptly introduced to obtain an ambient comprising $Ar/N_2/O_2$. At time T2, the $N_2$ is abruptly shut off to obtain an ambient of $Ar/O_2$. Things are reversed to obtain the remainder of the film stack. At time T3, the $N_2$ is abruptly re-introduced to obtain an ambient again comprising $Ar/N_2/O_2$, and at time T4, the $O_2$ is abruptly shut off to leave only $Ar/N_2$. These various changes in gases may be performed substantially continuously by simply opening and closing valves, and thus without substantially interrupting the sputtering process.

In one or more embodiments, the metal may again comprise Ta, causing the MIM capacitor 200 in FIG. 2 to consist of (starting from the bottom): $TaN_x/TaO_xN_y/TaO_x/TaO_xN_y/TaN_x$. The $TaO_x$ layer 211 may consist of stoichiometric $Ta_2O_5$, meaning that x equals 2.5 in this layer. At the same time, the $TaO_xN_y$ layers 212, 213 may serve to increase the compatibility between the $TaN_x$ layers 205, 215 and the $TaO_x$ layer 211. Again, as before, the ratio of the flow of $N_2$ to Ar may be modified when forming the bottom and top electrodes 205, 215 to achieve the desired resistivities for these electrodes 205, 215 (see Table I).

Even additional reactive sputtering processes in accordance with aspects of the invention may be utilized to impart MIM capacitors with even additional features that may be helpful in achieving the desired mechanical and electrical properties, as well as the desired stability. For example, while the MIM capacitors 100, 200 in FIGS. 1 and 2 utilize abrupt, sharp interfaces between their constituent nitride, oxynitride, and oxide layers, alternative MIM capacitors falling within the scope of the invention may instead utilize layers with non-constant concentrations of oxygen and/or nitrogen, that is, "graded" layers. Additionally or alternatively, moreover, MIM capacitors may utilize bottom and top electrodes that each include more than one layer of material (i.e., multilayer electrodes).

Figure 3:
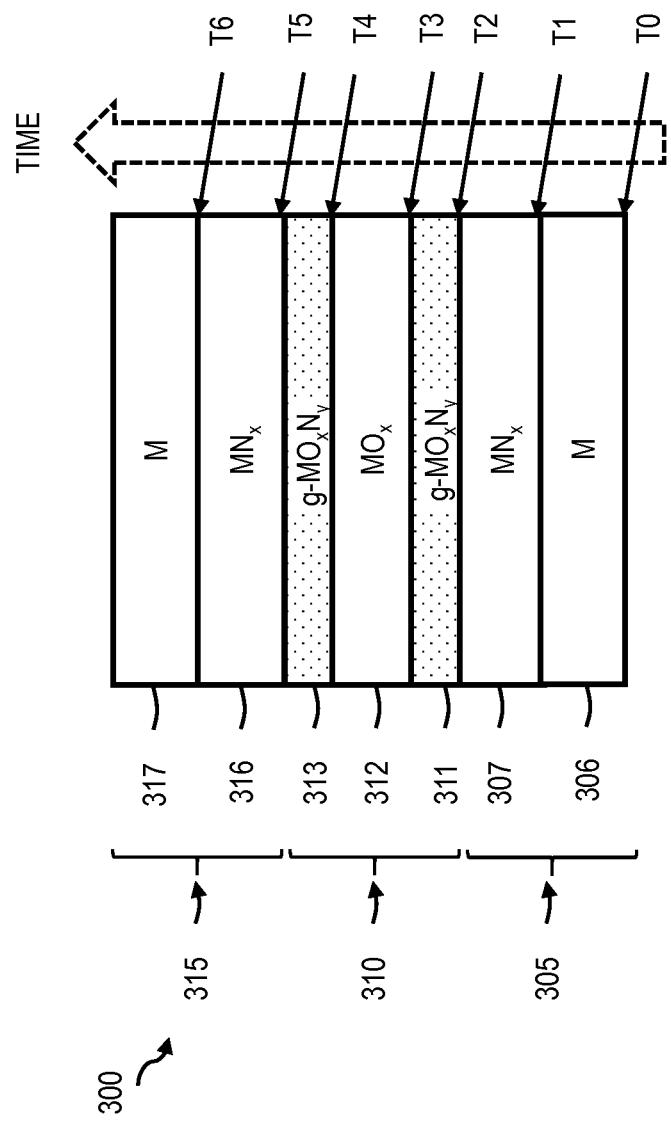
FIG. 3 shows a sectional view of a third MIM capacitor in accordance with an illustrative embodiment of the invention.

A sectional view of a third MIM capacitor 300 with both of these features, in accordance with an illustrative embodiment of the invention, is shown in sectional view in FIG. 3 along with its associated reactive sputter processing timeline. In this particular illustrative, non-limiting embodiment, the MIM capacitor 300 comprises a bottom electrode 305 formed of a layer of pure (i.e., non-oxidized and nonnitridized) metal (M) 306 topped by a layer of $MN_x$ 307. Assuming the $MN_x$ has a low resistivity, the bottom electrode 305 is therefore a metallic bilayer. Above the bottom electrode 305, an insulator 310 comprises a lower graded layer of $MO_xN_y$ (g-$MOxN_y$) 311 where nitrogen to oxygen ratio decreases as one moves upward, a middle layer of $MO_x$ 312, and an upper layer of g-$MO_xN_y$ 313 where the the nitrogen to oxygen ratio increases as one moves upward. Lastly, above the insulator 310 is a top electrode 315 comprising a metallic bilayer consisting of a layer of $MN_x$ 316 topped by a layer of pure M 317. Formed in this manner, the g-$MO_xN_y$ layers 311, 313 within the insulator 310 create a gradual transition between the $MN_x$ layers 307, 316 in the electrodes 305, 315 and the $MO_x$ layer 312 in the center of the insulator 310. One thereby achieves gradual interfaces rather than sharp ones.

Formation of the MIM capacitor 300 starts at time T0 with the sputtering of metal in Ar without the addition of $N_2$ or $O_2$. At T1, $N_2$ is introduced to obtain a Ar/$N_2$ ambient. At time T2, the $N_2$ flow is progressively ramped down while the $O_2$ flow is slowly ramped up to achieve the lower g-$MO_xN_y$ layer 311. At time T3, the ambient just contains Ar/$O_2$. Subsequently, at time T4 the $O_2$ flow is progressively ramped down while the $N_2$ flow is ramped up to form the upper g-$MO_xN_y$ layer 313. At time T5, only Ar/$N_2$ is flowed. Finally, at time T6, the $N_2$ is shut off, just leaving Ar.

As was the case for the MIM capacitors 100, 200, the metal in the MIM capacitor 300 may comprise Ta, causing the MIM capacitor 300 to have the following film stack in FIG. 3 (starting from the bottom): Ta/$TaN_x$/g-$TaO_xN_y$/$TaO_x$/g-$TaO_xN_y$/$TaN_x$/Ta. The $TaO_x$ may comprise stoichiometric tantalum pentoxide, $TaO_{2.5}$ (i.e., $Ta_2O_5$). The $TaN_x$ layers 307, 316 act as diffusion barriers between the pure Ta layers 306, 317 and the oxygen-containing Ta layers 311, 312, 313. Use of the Ta/$TaN_x$ metallic bilayers for the bottom and top electrodes 305, 315, allows the resistivities of the electrodes 305, 315 to be precisely controlled. In one or more embodiments, for example, the bottom and top electrodes 305, 315 may each have resistivities between, for example, 0.2 and 50 mΩ-cm, although these particular values are merely by way of illustration.

In summary, methods in accordance with aspects of the invention provide means for forming MIM capacitors utilizing a unitary, substantially-continuous reactive sputtering process. During sputtering, gas flows of $N_2$ and $O_2$ are modulated while a metal is sputtered to give the desired film stack. The MIM capacitors therefore comprise nitrides and oxides of a given metal, and in some cases oxynitrides of that metal. Interfaces may be sharp or may be graded. Sharp interfaces are formed by abruptly changing the ambient gas flows. Graded interfaces are formed by progressively ramping up the flow of one gas while progressively ramping down the flow of the other. So formed, a MIM capacitor may be tailored to give the desired mechanical and electrical properties, as well as the desired stability.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the invention.

It should again be emphasized that the above-described embodiments of the invention are intended to be illustrative only. Other embodiments may, for example, utilize different materials and processing steps from those expressly set forth above to achieve embodiments falling within the scope of the invention. These many alternative embodiments will be apparent to one having ordinary skill in the relevant arts.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for forming a metal-insulator-metal (MIM) capacitor on a substrate, the method comprising the steps of:
    sputtering a target comprising a metal in the presence of nitrogen to form at least a portion of a bottom electrode;
    sputtering the target in the presence of oxygen to form at least a portion of an insulator; and
    sputtering the target in the presence of nitrogen to form at least a portion of a top electrode;
    wherein:
       the insulator is sandwiched between the bottom electrode and the top electrode; and
       formation of the bottom electrode, the insulator, and the top electrode is performed in a sputter deposition chamber without removing the substrate therefrom.

2. The method of claim 1, wherein the formation of the bottom electrode, the insulator, and the top electrode is performed in a substantially continuous manner.

3. The method of claim 1, wherein the metal comprises tantalum.

4. The method of claim 1, wherein the metal comprises a metal selected from the group consisting of titanium, zirconium, hafnium, vanadium, and niobium.

5. The method of claim 1, wherein formation of the bottom electrode, the insulator, and the top electrode comprises sputtering in the presence of argon.

6. The method of claim 1, wherein forming the insulator comprises sputtering the target in the simultaneous presence of oxygen and nitrogen.

7. The method of claim 1, wherein forming the insulator comprises sputtering the target in the simultaneous presence of oxygen and nitrogen while progressively changing the ratio of oxygen to nitrogen.

8. The method of claim 1, wherein the bottom electrode comprises a nitride of the metal.

9. The method of claim 1, wherein the insulator comprises an oxide of the metal.

10. The method of claim 9, wherein the oxide of the metal is a stoichiometric oxide of the metal.

11. The method of claim 1, wherein the insulator comprises an oxynitride of the metal.

12. The method of claim 11, wherein the oxynitride of the metal is at least partially graded with a progressively changing ratio of oxygen to nitrogen over thickness.

13. The method of claim 1, wherein the bottom electrode comprises tantalum nitride.

14. The method of claim 1, wherein the insulator comprises tantalum pentoxide.

15. The method of claim 1, wherein the insulator comprises tantalum oxynitride.

* * * * *